(12) United States Patent        (10) Patent No.:     US 12,481,202 B2
Knobloch et al.                  (45) Date of Patent:     Nov. 25, 2025

(54) OPTICALLY BASED ANALOG-DIGITAL CONVERTER

(71) Applicant: UNIVERSITÄT PADERBORN KÖR, Paderborn (DE)

(72) Inventors: Christine Knobloch, Paderborn (DE); Benjamin Brecht, Paderborn (DE); Stephan Kruse, Paderborn (DE); Tobias Schwabe, Paderborn (DE)

(73) Assignee: UNIVERSITÄT PADERBORN KÖR, Paderborn (DE)

( * ) Notice: Subject to any disclaimer, the term of this patent is extended or adjusted under 35 U.S.C. 154(b) by 0 days.

(21) Appl. No.: 18/979,213

(22) Filed: Dec. 12, 2024

(65) Prior Publication Data

US 2025/0199380 A1     Jun. 19, 2025

(30) Foreign Application Priority Data

Dec. 13, 2023 (DE) .......................... 102023212604.4

(51) Int. Cl.
*H03M 1/00* (2006.01)
*G02F 1/35* (2006.01)
(Continued)

(52) U.S. Cl.
CPC .............. *G02F 7/00* (2013.01); *G02F 1/3501* (2013.01); *G02F 1/3551* (2013.01); *G02F 1/365* (2013.01); *G02F 2203/26* (2013.01)

(58) Field of Classification Search
CPC ...... H03M 1/12; H03M 13/6597; H03M 1/66; H03M 1/662; H03M 9/00; H03M 1/002;
(Continued)

(56) References Cited

U.S. PATENT DOCUMENTS 6,650,458 B1 * 11/2003 Prosyk ................... G02F 1/225
                                                          385/9
7,106,497 B2 *  9/2006 Kawanishi ............... G02F 2/02
                                                         359/326
(Continued)

OTHER PUBLICATIONS

Kress et al., "Analysis of the effects of jitter, relative intensity noise, and nonlinearity on a photonic digital-to-analog converter based on optical Nyquist pulse synthesis," Optics Express, vol. 29, No. 15, Jul. 19, 2021, pp. 23671-23681.

(Continued)

*Primary Examiner* — Linh V Nguyen
(74) *Attorney, Agent, or Firm* — Sheridan Ross P.C.

(57) ABSTRACT

The invention relates to an optically-based digital-to-analogue converter comprising
  A first pulse shaper, and a second pulse shaper,
  A first combiner, with a first input for a signal from the first pulse shaper, and a second input for a further signal,
  A second combiner, with a first input for a signal from the second pulse shaper, and a second input for the further signal,
  A first quantum pulse shaper, and a second quantum pulse shaper,
  Whereby the first quantum pulse shaper receives the output signal of the first combiner in the course of operation, and the second quantum pulse shaper receives the output signal of the second combiner in the course of operation,
  A third combiner, which combines the output signals of the first quantum pulse shaper and the second quantum pulse shaper in the course of operation,
  An evaluation unit, which evaluates the output signal of the third combiner.

13 Claims, 6 Drawing Sheets

(51) Int. Cl.
   *G02F 1/355*  (2006.01)
   *G02F 1/365*  (2006.01)
   *G02F 7/00*   (2006.01)
(58) Field of Classification Search
   CPC .... H03M 1/08; H03M 1/0881; H03M 1/1033;
          H03M 1/1245; H03M 1/661; H03M 1/74;
          H03M 1/742; H03M 1/80; H03M 1/808;
          H03M 3/40; H03M 3/462; H03M 3/468;
             H04L 9/0858; H04L 9/0852; H04L
             9/0855; H04L 2209/12; H04L 7/0075;
             H04L 2209/08; H04L 2209/80; H04L
             45/40; H04L 49/251; H04L 7/033; H04L
             9/001; H04L 9/002; H04L 9/08; H04L
             9/0825; G02F 1/3131; G02F 1/3526;
             G02F 1/3536; G02F 1/395; G02F 7/00;
             G02F 1/212; G02F 1/017; G02F 1/01775;
             G02F 1/01791; G02F 1/035; G02F
             1/3501; G02F 1/3507; G02F 1/353; G02F
             1/3532; G02F 1/3534; G02F 1/3544;
             G02F 1/365; G02F 1/37; G02F 1/377;
             G02F 1/39; G02F 1/392; G02F 2/002;
             G02F 2/004; G02F 2202/105; G02F
             2202/108; G02F 2203/15; H03K 5/1252;
             H03K 3/38; H03K 17/6871; H03K 17/92;
             H03K 19/195; H03K 3/012; H03K 3/42;
             H03K 3/78; H03K 3/84; H03K 5/02;
             H03K 19/1954; H03K 17/693; H04J
             14/02; H04J 14/02216; H04J 14/0227;
             H04J 14/0241; H04J 14/0282; G02B
             6/125; G02B 6/126; G06F 1/06; G06F
             1/105; G06F 17/18; G06F 7/49947
   USPC .......................... 341/144, 137, 138, 140–142
   See application file for complete search history.

(56) References Cited

U.S. PATENT DOCUMENTS

| | | | | |
|---|---|---|---|---|
| 7,127,174 B2* | 10/2006 | Liu | ........................ | H04J 14/08 |
| | | | | 398/103 |
| 7,272,271 B2* | 9/2007 | Kaplan | .............. | H04B 10/5053 |
| | | | | 359/254 |
| 7,391,367 B2* | 6/2008 | Newberg | ............. | H01Q 3/2676 |
| | | | | 398/116 |
| 8,050,351 B2* | 11/2011 | Cho | ........................ | H04B 10/60 |
| | | | | 375/279 |
| 2002/0171900 A1* | 11/2002 | Ono | .................. | H04B 10/50572 |
| | | | | 398/183 |
| 2003/0095311 A1* | 5/2003 | Liu | .......................... | H04J 14/08 |
| | | | | 398/102 |
| 2003/0165001 A1* | 9/2003 | Uesaka | .................... | G02F 1/225 |
| | | | | 359/279 |
| 2005/0175357 A1* | 8/2005 | Kawanishi | ........... | H04B 1/7174 |
| | | | | 398/187 |
| 2005/0220385 A1* | 10/2005 | Kawanishi | ............ | G02F 1/3136 |
| | | | | 385/1 |
| 2007/0133918 A1* | 6/2007 | Cho | ................. | H04B 10/50577 |
| | | | | 385/3 |
| 2010/0045974 A1* | 2/2010 | Kaertner | .................. | G01J 11/00 |
| | | | | 356/229 |
| 2011/0064351 A1* | 3/2011 | Kise | ....................... | G02F 1/2257 |
| | | | | 385/3 |
| 2012/0032081 A1* | 2/2012 | Itsuji | .......................... | G02F 1/35 |
| | | | | 250/340 |
| 2015/0036210 A1* | 2/2015 | Asobe | ................... | G02F 1/3544 |
| | | | | 359/341.3 |
| 2021/0278746 A1 | 9/2021 | Kita | | |
| 2023/0297872 A1* | 9/2023 | Semo | ..................... | G06N 10/40 |
| | | | | 716/100 |
| 2024/0412089 A1* | 12/2024 | Underwood | ............ | H03M 1/66 |

OTHER PUBLICATIONS

Kurokawa et al., "Over 300 GHz bandwidth UTC-PD module with 600 GHz band rectangular-waveguide output," Electronics Letters, vol. 54, No. 11, May 31, 2018, pp. 705-706.

Olieman et al., "An Interleaved Full Nyquist High-Speed DAC Technique," IEEE Journal of Solid-State Circuits, vol. 50, No. 3, Mar. 2015, 10 pages.

Rahman et al., "A cryogenic DAC operating down to 4.2K," Cryogenics, vol. 75, 2016, pp. 47-55.

Zurita et al., "Cryogenic Current Steering DAC With Mitigated Variability," IEEE Solid-State Circuits Letters, vol. 3, 2020, 5 pages.

Search Report for Germany Patent Application No. 102023212604.4, dated Dec. 7, 2024, 8 pages.

* cited by examiner

OPTICALLY BASED ANALOG-DIGITAL CONVERTER

CROSS-REFERENCE TO RELATED APPLICATIONS

This application claims the benefit of German Application No. 102023212604.4 filed Dec. 13, 2023, the entire contents of which are incorporated herein by reference in its entirety.

TECHNICAL FIELD

The invention relates to an optically-based digital-to-analogue converter.

BACKGROUND

Modern DACs are limited in their bandwidth by the bandwidth of the electrical components. In order to circumvent this, interleaved architectures with multiplexers are used, for example [1].

[1] E. Olieman, A. -J. Annema and B. Nauta, "An Interleaved Full Nyquist High-Speed DAC Technique," in IEEE Journal of Solid-State Circuits, vol. 50, no. 3, pp. 704-713, March 2015, doi: 10.1109/JSSC.2014.2387946.

These and similar solutions can only solve the problem of bandwidth limitation to a limited extent. In order to generate an arbitrarily high bandwidth, an indefinitely large number of DAC components must be interconnected. However, even this solution cannot be expanded indefinitely, as the multiplexer will eventually become the bandwidth-limiting element. While it is possible to use architectures with interconnected multiplexers, both the interconnection of multiplexers and the interconnection of DAC components increases the complexity and the probability of failure of the entire DAC.

The system shown in [1] is limited in its bandwidth by the DAC components and the multiplexers that are used. In addition, the interleaving of the DAC components and the multiplexers increases the overall complexity of the DAC, and therefore increases the probability of failure, and also the energy consumption of the DAC.

What Prior Art are You Aware Of?

In [2], a photonically supported DAC has been demonstrated that bypasses the multiplexer with the aid of Nyquist pulses.

This means that N DACs can be interconnected to generate almost any bandwidth.

[2] Christian Kress, Meysam Bahmanian, Tobias Schwabe, and J. Christoph Scheytt, "Analysis of the effects of jitter, relative intensity noise, and nonlinearity on a photonic digital-to-analog converter based on optical Nyquist pulse synthesis," Opt. Express 29, 23671-23681 (2021)

In a similar manner to the concept shown in [1], a number of DAC components are interconnected in the concept shown in [2] so as to increase the bandwidth. As in [1], this increases the overall complexity of the DAC, and therefore the probability of failure and a higher energy consumption.

In [3] & [4] a DAC has been shown that operates at cryogenic temperatures in order to implement the interface between classical electronics and a quantum computer.

[3] M. E. P. V. Zurita et al, "Cryogenic Current Steering DAC With Mitigated Variability," in IEEE Solid-State Circuits Letters, vol. 3, pp. 254-257, 2020, doi: 10.1109/LSSC.2020.3013443.

[4] M. T. Rahman, T. Lehmann, "A cryogenic DAC operating down to 4.2K," Cryogenics, Volume 75, 2016, Pages 47-55, ISSN 0011-2275, https://doi.org/10.1016/j.cryogenics.2016.02.003.

The system shown in [3] and [4] operates at cryogenic temperatures and is therefore not suitable for the mass market. In addition, these DACs do not have any kind of quantum support. The DACs shown in these papers are only intended to operate together with a quantum system.

Although these approaches of known art represent an improvement, they are not able to solve the problems (internal noise as well as internal distortion) in a sustainable and cost-effective manner, with the result that the resolution accuracy of the analogue signal remains limited.

SUMMARY

Starting out from this situation, the object of the invention is to provide an optically-based analogue-to-digital converter that makes it possible to digitise any analogue signals with high resolution accuracy, low distortion and low internal noise.

The object is achieved by an optically-based digital-to-analogue converter in accordance with Claim 1. Further advantageous configurations are in particular the subject matter of the dependent claims.

BRIEF DESCRIPTION OF THE DRAWINGS

In what follows the invention is explained in more detail with reference to the figures. Here.

DETAILED DESCRIPTION

In what follows the invention will be described in more detail, with reference to the figures. Here it should be noted that various aspects are described, each of which can be used individually, or in combination. In other words, each aspect can be used with different forms of embodiment of the invention, unless explicitly presented as a pure alternative.

Furthermore, for the sake of simplicity, in what follows reference will generally only ever be made to one entity. Unless explicitly stated, however, the invention may also comprise a plurality of the entities concerned. In this respect, the use of the word "one" is only to be understood as an indication that at least one entity is used in a simple form of embodiment.

Insofar as methods are described in what follows, the individual steps of a method can be arranged and/or combined in any order, unless the context explicitly indicates otherwise. Furthermore, the methods can be combined with one another, unless it is explicitly indicated otherwise.

In general data with numerical values are not to be understood as exact values, but rather include a tolerance from +/−1% up to +/−10%.

References to standards or specifications are to be understood as references to standards or specifications that are in force at the time of the application, and/or—if priority is being claimed—at the time of the priority application. However, this is not to be understood as a general exclusion of applicability to subsequent or superseding standards or specifications.

FIGS. 1-6 show exemplary forms of embodiment of the invention.

In forms of embodiment of the invention, an optically-based digital-to-analogue converter 1 is provided.

Figure 1:
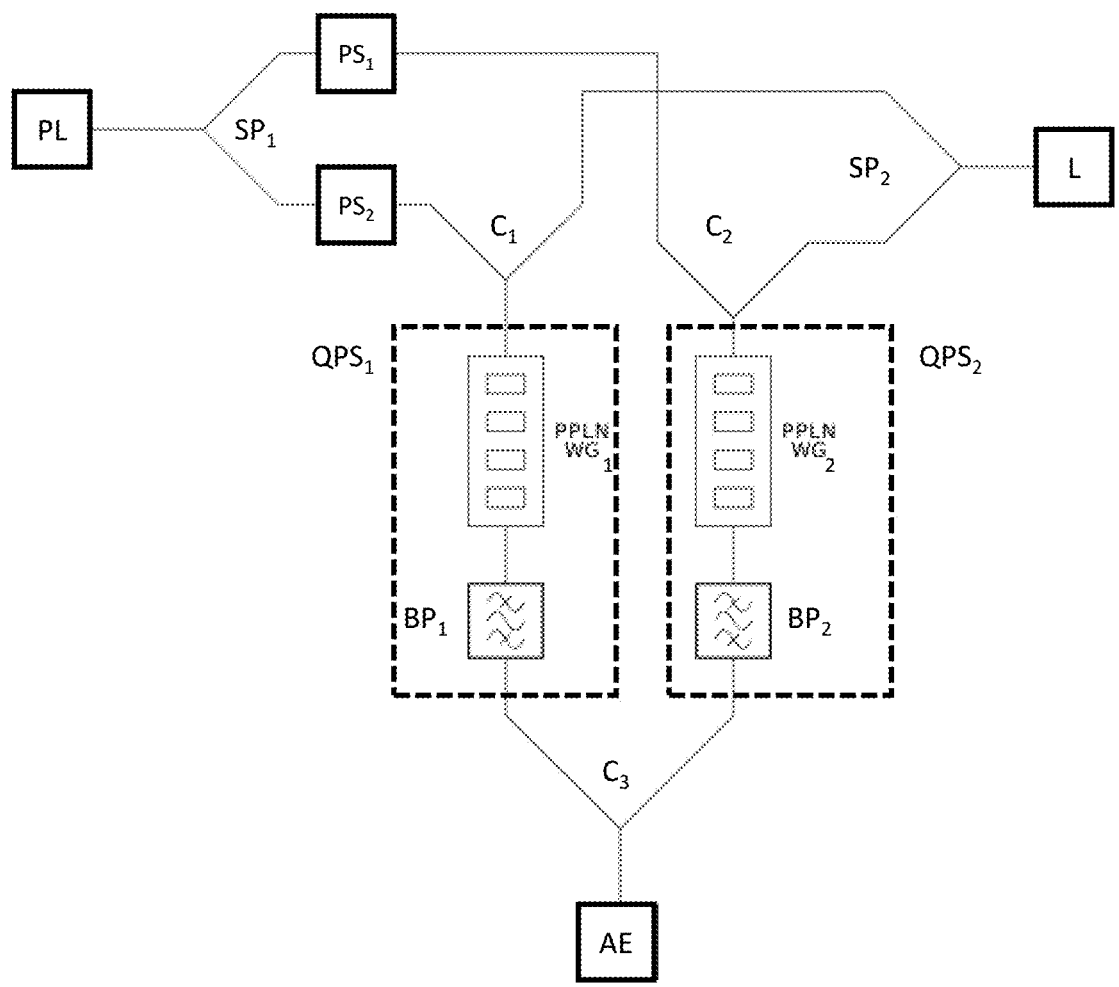
FIGS. 1-6 schematically illustrate various aspects of forms of embodiment of an optically-based digital-to-analogue converter, in accordance with forms of embodiment of the invention.

The basic principle is shown in FIG. 1. The optically-based digital-to-analogue converter 1 has a first pulse shaper $PS_1$ and a second pulse shaper $PS_2$, together with a first combiner $C_1$ with a first input $I_1$ for a signal from the first pulse shaper $PS_1$, and a second input $I_2$ for a further signal, a second combiner $C_2$ with a first input $I_3$ for a signal from the second pulse shaper $PS_2$, and a second input $I_4$ for the further signal.

Furthermore, the optically-based digital-to-analogue converter 1 has a first quantum pulse shaper $QPS_1$, and a second quantum pulse shaper $QPS_2$.

In the course of operation, the first quantum pulse shaper $QPS_1$ receives the output signal from the first combiner $C_1$, and the second quantum pulse shaper $QPS_2$ receives the output signal from the second combiner $C_2$.

In addition, the optically-based digital-to-analogue converter 1 has a third combiner $C_3$, which combines the output signals of the first quantum pulse shaper $QPS_1$ and the second quantum pulse shaper $QPS_2$ in the course of operation, and an evaluation unit AE, which evaluates the output signal of the third combiner $C_3$.

In the course of operation, an optical pulsed signal is therefore split into two paths and its spectral properties are then altered with the aid of a pulse-shaping element. This pulse shaper can be controlled by means of a digital element. Here, for example, Hermite Gaussian modes (HGMs) can be used.

These two signals, together with two further signals, which are likewise provided by splitting the light from a (second) source, are fed into two quantum pulse shapers $QPS_1$, $QPS_2$, which have, for example, a non-linear waveguide (PPPLN WG).

By means of the non-linear process in the quantum pulse shapers $QPS_1$, $QPS_2$ an output signal is generated that has the desired spectral properties.

Heterodyne detection within an evaluation unit AE, for example a detector, can be used to generate an electrical signal that is proportional to the difference between the two optical signals. By means of the number of HGMs used, any desired resolution of the output signal can be generated.

A quantum-assisted DAC is therefore implemented by means of the invention.

The optically-based digital-to-analogue converter 1 demonstrated in this invention is only limited in bandwidth to a small extent by the surrounding electronic hardware. A "limitation"—if it could be perceived as such (at least in comparison to previous approaches), is essentially due to the bandwidth of the evaluation unit AE.

However, photodiodes that can be used as detectors, and have a bandwidth of more than 300 GHz, have already been demonstrated in the literature, see for example the article "Over 300 GHz bandwidth UTC-PD module with 600 GHz band rectangular-waveguide output" by the authors T. Kurokawa, T. Ishibashi, M. Shimizu, K. Kato, & T. Nagatsuma, published in Electronics Letters, 2018, 54, pages 705-706.

Furthermore, the optically-based digital-to-analogue converter 1 shown in the present invention can also circumvent the limiting influence of the detector by using interleaving techniques similar to those of classical DACs, or optically-assisted DACs.

In one form of embodiment of the invention (see in particular FIGS. 1-3), the optically-based digital-to-analogue converter 1 further comprises a first splitter $SP_1$, which splits a pulsed input signal in the course of operation, and allocates it to the first pulse shaper $PS_1$ and the second pulse shaper $PS_2$.

Figure 2:
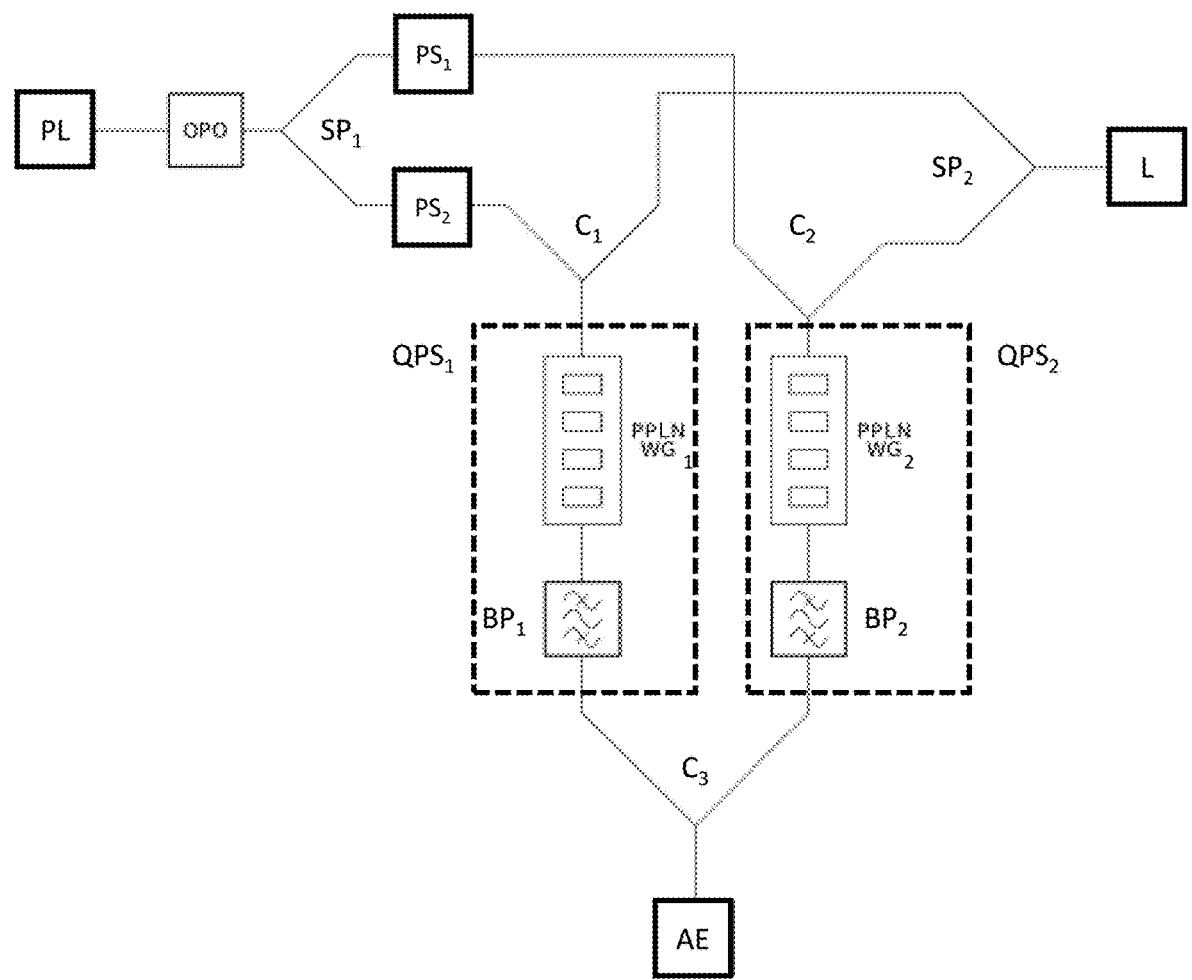
Figure 6:
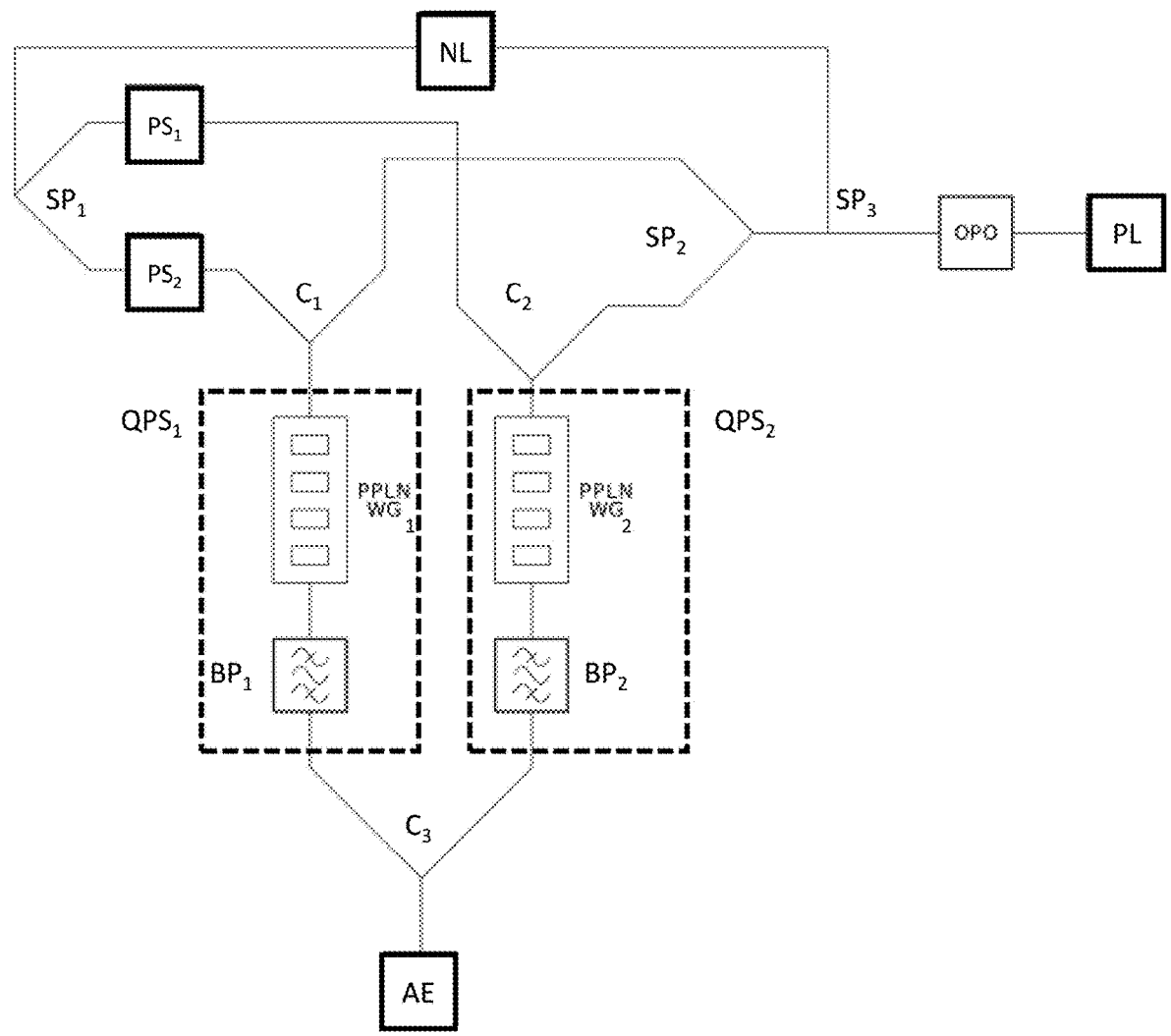

In accordance with one form of embodiment of the invention, the optically-based digital-to-analogue converter 1 further comprises a first splitter $SP_1$, which splits a pulsed input signal in the course of operation, and allocates it to the first pulse shaper $PS_1$ and the second pulse shaper $PS_2$, whereby the pulsed optical input signal first passes through an optical parametric oscillator OPO (see, in particular, FIGS. 2 and 6).

Figure 3:
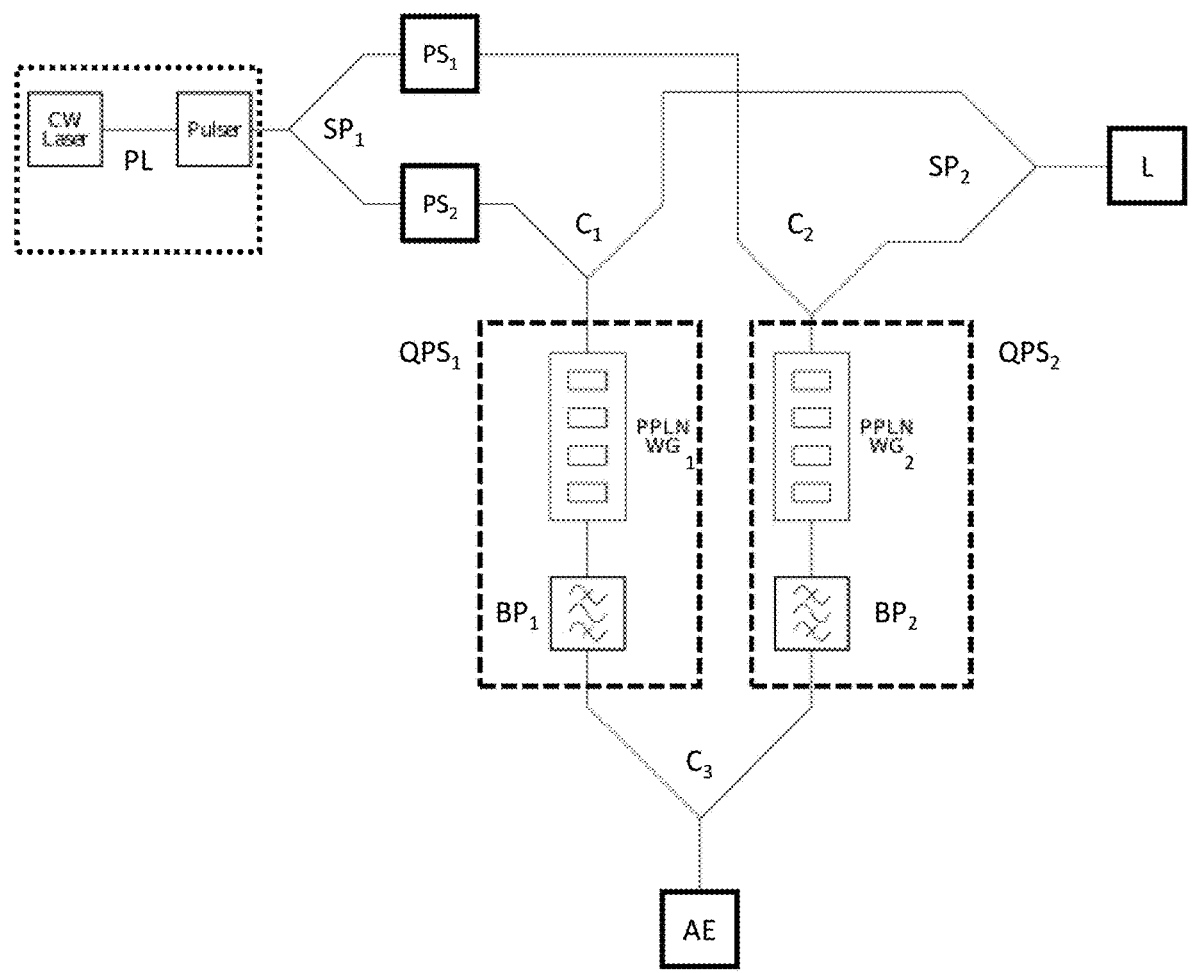
Figure 4:
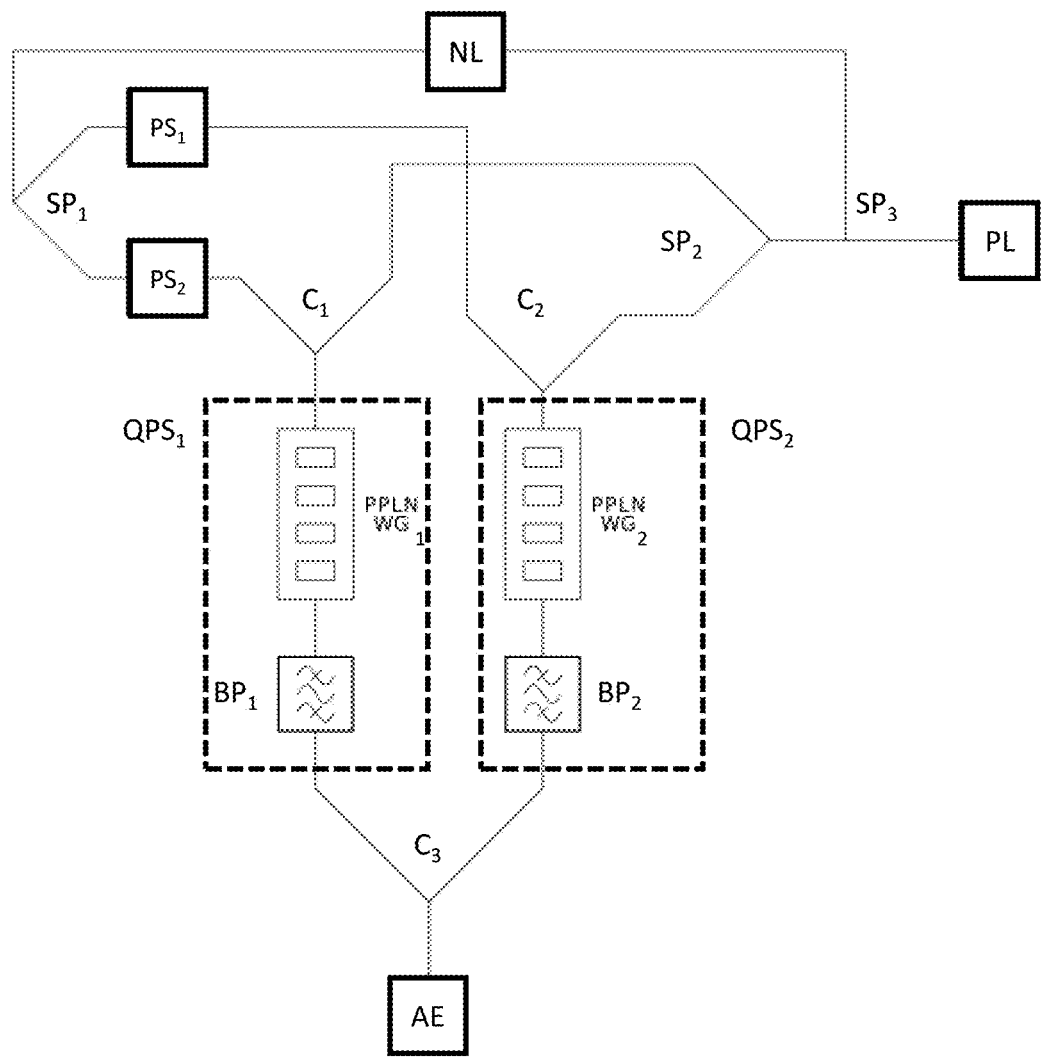
Figure 5:
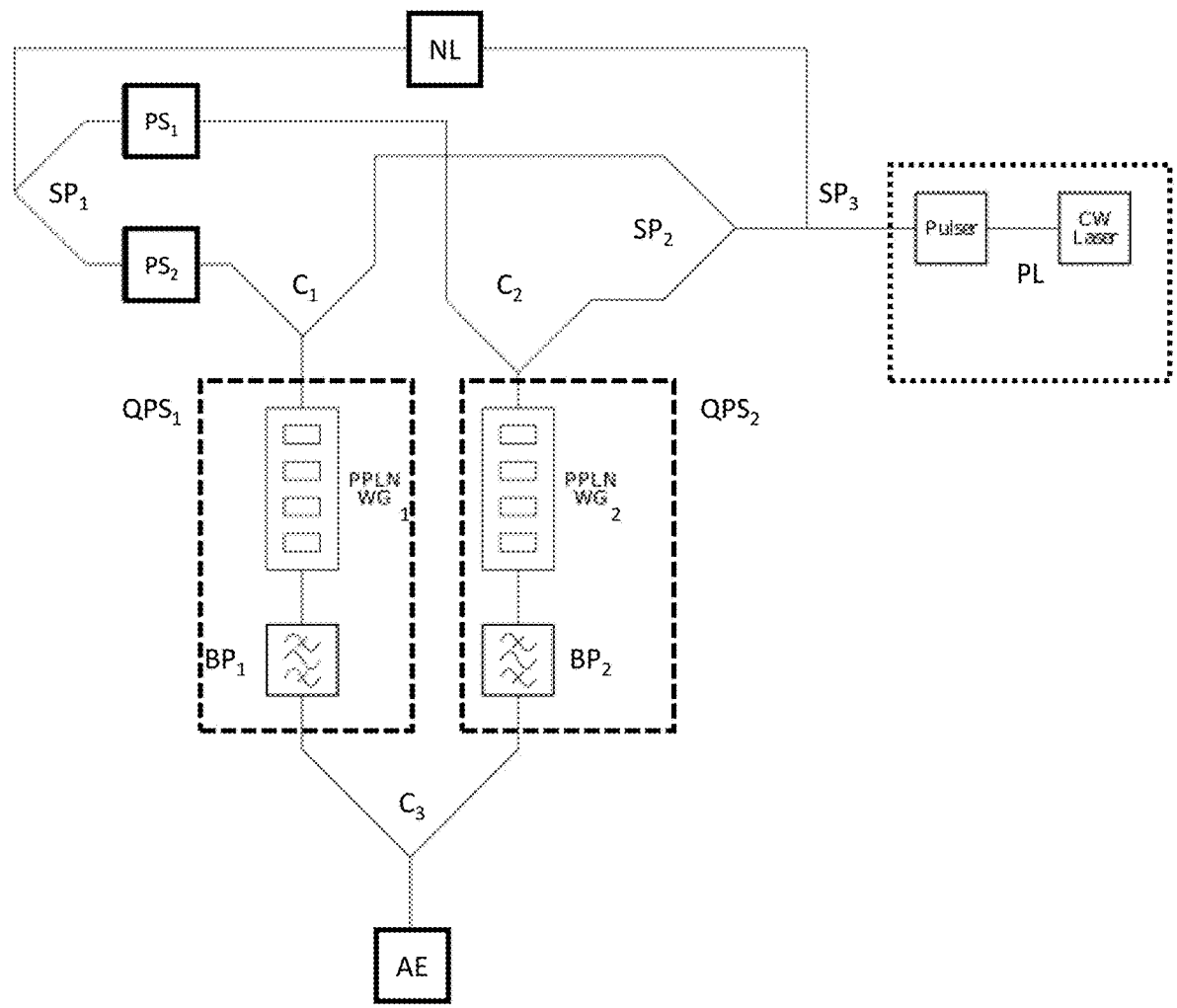

In a further form of embodiment of the invention, the input signal for the first pulse shaper $PS_1$ and the second pulse shaper $PS_2$ is provided by a continuous wave laser CW and a pulser P in the course of operation (see, in particular, FIGS. 3 and 5).

In accordance with a further form of embodiment of the invention, the further signal is generated by a further laser L, whereby the further signal is split in the course of operation by a second splitter $SP_2$, before being fed to the first combiner $C_1$ and the second combiner $C_2$ (see, in particular, FIGS. 1-3).

In yet a further form of embodiment of the invention, the input signal to the first pulse shaper $PS_1$ and the second pulse shaper $PS_2$, and the further signal, originate from a common source (see FIGS. 4-6), whereby the input signal to the first pulse shaper $PS_1$ and the second pulse shaper $PS_2$ is changed in frequency in the course of operation by a non-linear element NL.

In accordance with yet a further form of embodiment of the invention, the first quantum pulse shaper $QPS_1$ has a first non-linear waveguide $PPLN\text{-}WG_1$ and a first optical bandpass filter $BP_1$, and the second quantum pulse shaper $QPS_2$ has a second non-linear waveguide $PPLN\text{-}WG_2$ and a second optical bandpass filter $BP_2$.

In accordance with one form of embodiment, the first quantum pulse shaper $QPS_1$, and/or the second quantum pulse shaper $QPS_2$, in each case has a polarised non-linear waveguide.

In accordance with a further form of embodiment, the first quantum pulse shaper $QPS_1$ and the second quantum pulse shaper $QPS_2$ in each case have a polarised lithium niobate waveguide, or a polarised potassium titanyl phosphate waveguide.

In forms of embodiment of the invention, the non-linear waveguide can be periodically, or aperiodically, polarised.

In accordance with yet a further form of embodiment, the optically-based digital-to-analogue converter 1 is fully integrated, or partially integrated, or designed with discrete components.

A further form of embodiment of the invention may utilise either two optical sources instead of the first optical source, and/or two optical sources instead of the second optical source.

Another form of embodiment is shown in FIG. 3. In this form of embodiment, the first optical source, which was previously implemented as a pulsed source, is replaced by a continuous source with a downstream pulse-generating element. Here it should be noted that the pulse-generating element can also undertake the pulse shaping.

The invention claimed is:

1. An optically-based digital-to-analogue converter comprising:
   a first pulse shaper and a second pulse shaper;
   a first combiner comprising a first input for an optical signal from the first pulse shaper, and a second input for a further optical signal;

a second combiner comprising a first input for an optical signal from the second pulse shaper, and a second input for the further optical signal;

a first quantum pulse shaper and a second quantum pulse shaper, wherein the first quantum pulse shaper receives an output signal of the first combiner, and the second quantum pulse shaper receives an output signal of the second combiner;

a third combiner to combine output signals of the first quantum pulse shaper and the second quantum pulse shaper; and a detector to detect an output signal of the third combiner.

2. The optically-based digital-to-analogue converter in accordance with claim 1, further comprising a first splitter to split a pulsed input signal and allocate it to the first pulse shaper and the second pulse shaper.

3. The optically-based digital-to-analogue converter in accordance with claim 1, further comprising a first splitter to split a pulsed optical input signal and allocate it to the first pulse shaper and the second pulse shaper, wherein the pulsed optical input signal first passes through an optical parametric oscillator.

4. The optically-based digital-to-analogue converter in accordance with claim 1, wherein an input signal for the first pulse shaper and the second pulse shaper is provided by a continuous wave laser and a pulser.

5. The optically-based digital-to-analogue converter in accordance with claim 1, wherein the further optical signal is generated by a laser, wherein the further optical signal is split by a splitter before being fed to the first combiner and the second combiner.

6. The optically-based digital-to-analogue converter in accordance with claim 1, wherein the further optical signal and an input signal to the first pulse shaper and the second pulse shaper originate from a common source, and wherein the input signal to the first pulse shaper and the second pulse shaper is altered in frequency by a non-linear element.

7. The optically-based digital-to-analogue converter in accordance with claim 1, wherein the first quantum pulse shaper comprises a first non-linear waveguide and a first optical bandpass filter, and wherein the second quantum pulse shaper comprises a second non-linear waveguide and a second optical bandpass filter.

8. The optically-based digital-to-analogue converter in accordance with claim 7, wherein the first and second non-linear waveguides are polarised non-linear waveguides.

9. The optically-based digital-to-analogue converter in accordance with claim 7, wherein the first and second non-linear waveguides are either polarised lithium niobate waveguide or a polarised potassium titanyl phosphate waveguide.

10. The optically-based digital-to-analogue converter in accordance with claim 7, wherein the first and second non-linear waveguides are periodically polarised.

11. The optically-based digital-to-analogue converter in accordance with claim 7, wherein the first and second non-linear waveguides are aperiodically polarised.

12. The optically-based digital-to-analogue converter in accordance with claim 1, wherein the optically-based digital-to-analogue converter is implemented in a fully integrated manner.

13. An optically-based digital-to-analogue converter comprising:

a first pulse shaper and a second pulse shaper;

a first combiner comprising a first input for a signal from the first pulse shaper, and a second input for a further signal;

a second combiner comprising a first input for a signal from the second pulse shaper, and a second input for the further signal;

a first quantum pulse shaper and a second quantum pulse shaper; wherein the first quantum pulse shaper receives an output signal of the first combiner, and wherein the second quantum pulse shaper receives an output signal of the second combiner;

a third combiner to combine output signals of the first quantum pulse shaper and the second quantum pulse shaper; and a detector to detect an output signal of the third combiner, wherein:

the optically-based digital-to-analogue converter further comprises a first splitter to split a pulsed input signal and allocate it to the first pulse shaper and the second pulse shaper;

wherein the pulsed optical input signal first passes through an optical parametric oscillator;

an input signal for the first pulse shaper and the second pulse shaper is provided by a continuous wave laser and a pulser;

the further signal is generated by a further laser, wherein the further signal is split by a second splitter before being fed to the first combiner and the second combiner;

wherein the input signal to the first pulse shaper and the second pulse shaper is altered in frequency by a non-linear element;

the first quantum pulse shaper comprises a first non-linear waveguide and a first optical bandpass filter, and the second quantum pulse shaper comprises a second non-linear waveguide and a second optical bandpass filter;

the first and second non-linear waveguides are either a polarised lithium niobate waveguide or a polarised potassium titanyl phosphate waveguide; and the optically-based digital-to-analogue converter is implemented in a fully integrated manner.

* * * * *